Figure 1:
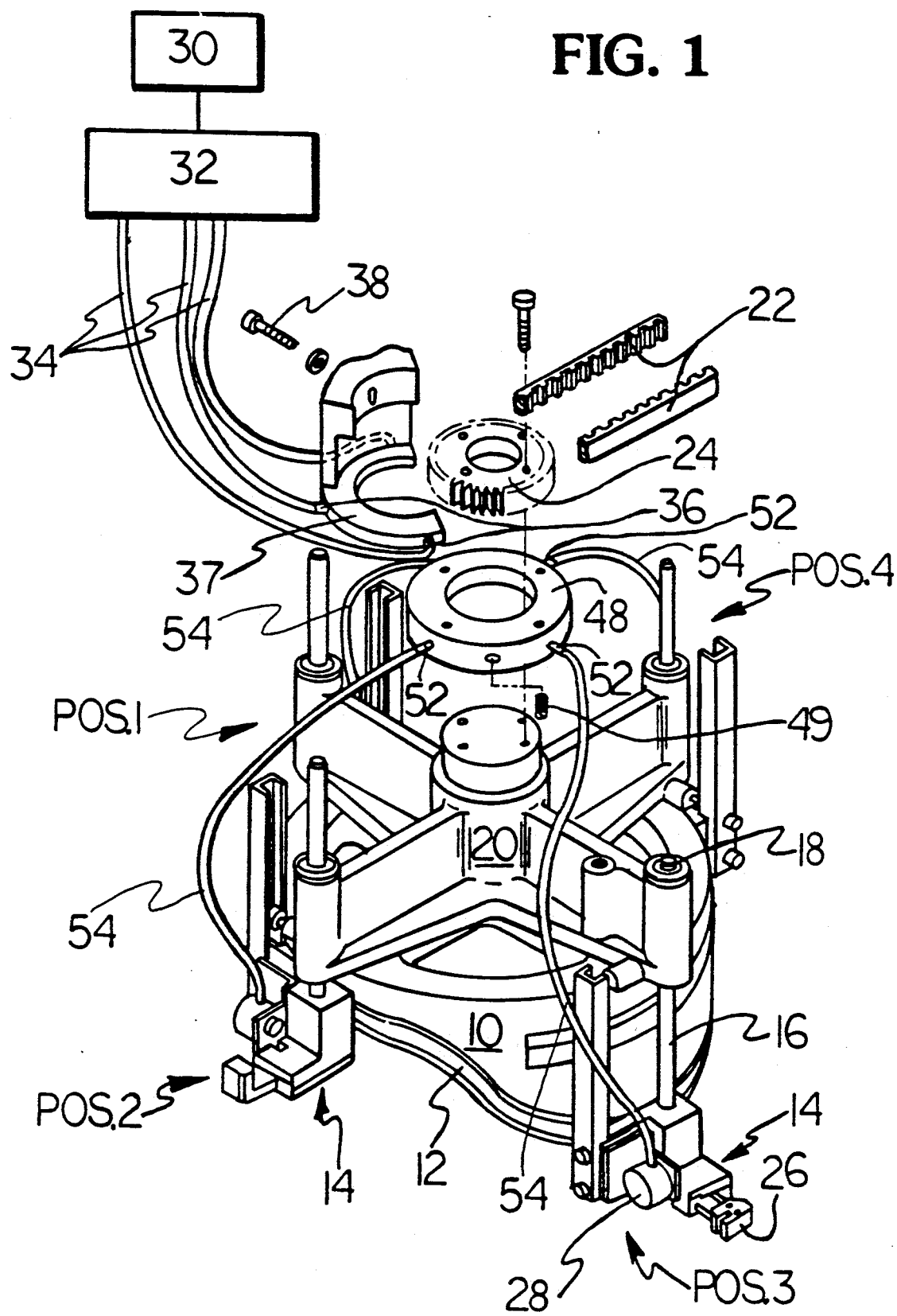

United States Patent [19]

St. Hilaire

[11] Patent Number: 5,075,961

[45] Date of Patent: Dec. 31, 1991

[54] RADIAL COMPONENT INSERTION MACHINE

[75] Inventor: Vance F. St. Hilaire, Beverly, Mass.

[73] Assignee: Dynapert Inc., Beverly, Mass.

[21] Appl. No.: 420,415

[22] Filed: Oct. 12, 1989

[51] Int. Cl.$^5$ .............................................. B23P 19/00
[52] U.S. Cl. .......................................... 29/739; 29/792; 29/35.5; 137/580; 277/27; 277/74; 277/75
[58] Field of Search ................ 29/739, 741, 785, 792, 29/35.5, 42; 137/580; 901/37, 28; 414/744.8; 277/27, 74, 75

[56] References Cited

U.S. PATENT DOCUMENTS 4,506,692 3/1985 Schlegel et al. ................... 137/102
4,691,419 9/1987 Keeler et al. ........................ 29/39

Primary Examiner—Joseph M. Gorski
Assistant Examiner—S. Thomas Hughes
Attorney, Agent, or Firm—Spencer T. Smith

[57] ABSTRACT

The tool gripping and releasing devices carried by the indexing turret head of a radial component insertion machine are air operated and sealed connections are selectively established between stationary and rotating air transfer rings. Supplied pressurized air leaves the stationary air transfer plate via blind bores and then forces its way through small apertures in gaskets which close these blind bores. The gasket material is deformed into sealing engagement with the rotating air transfer ring establishing a connection with the air inlet thereof.

2 Claims, 2 Drawing Sheets

RADIAL COMPONENT INSERTION MACHINE

The present invention relates to machines for inserting radial components into circuit boards and the like, and more particularly to a machine which utilizes a multi-position turret to pick up a component at one position with a finger gripper, pull the gripped component down at a second position and transfer the pulled down component from the finger gripper to an insertion head at a third position.

In such machines, the finger grippers are operated by air cylinders which are secured to the rotatable turret and air supplied from stationary inlets must be selectively connected to and disconnected from these air cylinders.

It is accordingly an object of the present invention to provide a means for simply and effectively making and breaking these air connections.

Other objects and advantages of the present invention will become apparent from the following portion of the specification and from the following drawings which illustrate in accordance with the mandate of the patent statutes a presently preferred embodiment incorporating the principles of the invention.

Figure 2:
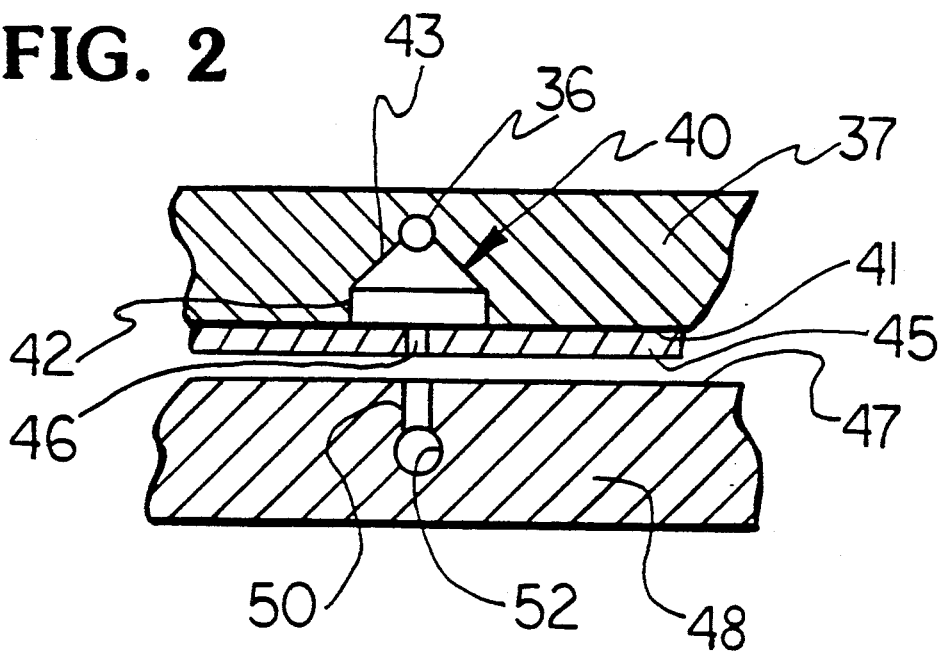

Referring to the drawings:

FIG. 1 is an oblique exploded view illustrating the turret mechanism of a radial component insertion machine; and FIG. 2 is an elevational cross-sectional view of one of the connectors used to selectively connect external air pressure to an air cylinder carried by the turret.

Figure 3:
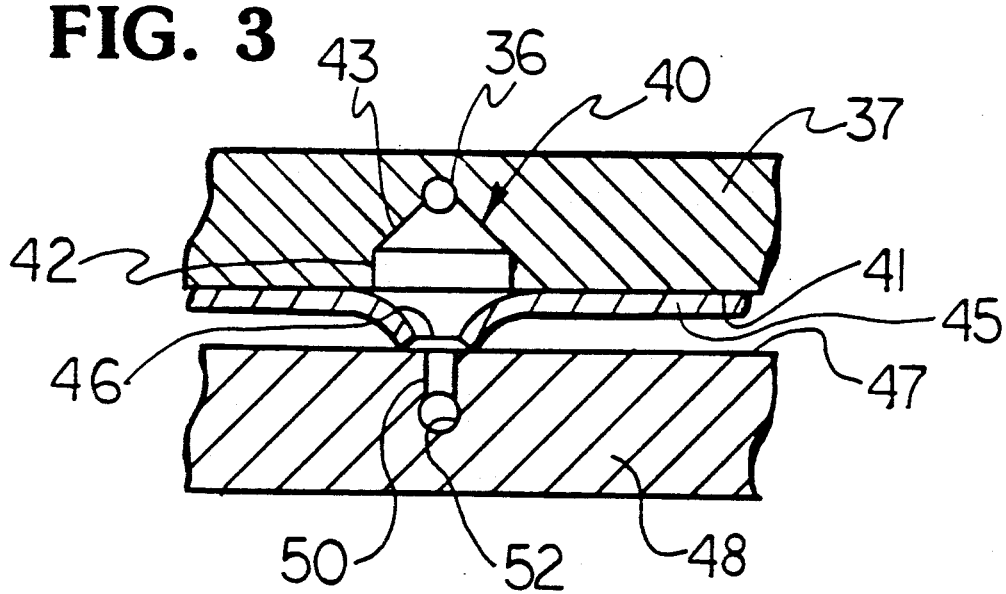

FIG. 3 is an elevational cross-sectional view of one of the connectors when activated by external air pressure The radial component insertion machine comprises a fixed cam track housing 10 which supports a continuous cam track 12. Four 90° spaced clamping heads 14 are secured to elongated shafts 16 which are slidingly supported for vertical displacement within corresponding bearings 18 of a turret 20 which is rotatable by a suitable belt 22 and pulley 24. The turret has four 90° spaced positions. Position 1 is the position where a radial component is transferred to the finger gripper, Position 2 is the position where a gripped radial component will be pulled down, Position 3 is the position where the pulled down radial component will be transferred to an insertion head and Position 4 is the empty position.

Each clamping head 14 has clamping fingers 26 which can be closed by operating a single action air cylinder 28. Air under pressure is supplied from a suitable source 30 to a valve stack 32 which can supply the pressurized air to individual conduits 34. A discrete air supply conduit 34 is provided for each turret position where the fingers are to be operated. In the preferred embodiment, the fingers 26 will be operated at the first three positions, and hence, there are three supply conduits. Each supply conduit 34 is connected to an inlet fitting 36 which enters a stationary air transfer ring 37 which is secured by a screw 38 to the machine frame (not shown). The inlet fitting 36 communicates with a bore 40 (FIG. 2) which is defined in the bottom surface 41 of the air transfer ring 37 and which has a cylindrical portion 42 at the opening of the bore and a conical portion 43. A 1/32" ring gasket 45 made from EPDM 6-65 shore "A" weather resistant rubber is adhesively secured to the bottom surface of the stationary air transfer ring and includes a cylindrical through hole 46 centrally located beneath the opening of each ring bore 40 and having a small fraction of the cross-sectional area thereof. This gasket 45 is spaced from the top surface 47 of a rotating air transfer ring 48 which is secured by a suitable screws 49 to the rotating turret 20. The turret is indexable at 90° increments to locate an inlet opening 50 in the rotating air transfer ring 48 in alignment with a ring gasket 45 opening 46 at each of the first three turret positions. These four openings 50 communicate with suitable fittings 52 which are connected to air conduits 54 which supply corresponding air cylinders 28.

When air under pressure is supplied to any inlet conduit 34, it will act on the ring gasket 45 forcing it to deflect downwardly until it forcefully engages the lower rotating air transfer ring 48 to thereby seal this surface (FIG. 3). Since the ring gasket is adhesively secured to the upper stationary air transfer ring 37 about the hole 40, a sealed conduit will thereby be defined connecting the hole 40 in the upper ring 37 to the hole 50 in the lower ring 48. Since the gasket is deformed downwardly, opening 46, shown in FIG. 2, defines a larger diameter d (FIG. 3) when air pressure is applied. The diameter being substantially larger than opening 50 permits limited relative rotational displacement of the stationary and rotatable air transfer rings while maintaining this sealed air connection. After the fingers have been operated, the valve stack cuts the air pressure to the inlet conduits and the deformed ring gasket portions, which defined these seals, return to their undeflected condition spaced from the lower ring and the lower ring can then be indexed 90° and the processes repeated.

I claim:

1. A machine for inserting a radial electronic component into a circuit board comprising
a turret head indexable through selected positions to displace a component from a gripping position to a release position, said turret head including
air operable radial component gripping means
air transfer ring means including
an air transfer ring having a flat upper surface and conduit means at each index location including an inlet in said flat upper surface, and
air conduit. means connecting said air transfer ring to said air operable radial component gripping means,
a stationary air transfer ring including
a flat lower surface parallel to and spaced from said flat upper surface,
a plurality of air inlets each communicating with a blind bore communicating with said flat lower surface,
planar gasket means secured to said flat lower surface in parallel relation with said flat lower surface and covering each of said blind bores, said gasket means having a hole defined therein within each of said blind bores and having a small fraction of the area thereof, and
said spacing between said upper and lower surfaces being selected so that when air under pressure is supplied to said stationary air transfer ring said planar gasket means at each blind bore will be forced outwardly to define a convex form which will be biased against said upper surface of said turret air transfer ring to thereby establish a sealed air connection between one of said blind bores and the associated inlet in said upper surface.

2. A radial component insertion machine according to claim 1, wherein said turret is indexable to four 90° spaced positions.

* * * * *